United States Patent
Fruehauf et al.

(10) Patent No.: US 8,314,035 B2
(45) Date of Patent: Nov. 20, 2012

(54) METHOD FOR THE MANUFACTURE OF AN ACTIVE MATRIX OLED DISPLAY

(75) Inventors: Norbert Fruehauf, Sindelfingen (DE); Thomas Buergstein, Remseck (DE); Patrick Schalberger, Stuttgart (DE)

(73) Assignee: Universitaet Stuttgart, Stuttgart (DE)

( * ) Notice: Subject to any disclaimer, the term of this patent is extended or adjusted under 35 U.S.C. 154(b) by 278 days.

(21) Appl. No.: 12/699,580

(22) Filed: Feb. 3, 2010

(65) Prior Publication Data
US 2010/0203656 A1    Aug. 12, 2010

(30) Foreign Application Priority Data
Feb. 6, 2009    (DE) .................. 10 2009 007 947

(51) Int. Cl.
*H01L 21/302* (2006.01)
(52) U.S. Cl. ........ 438/725; 438/328; 438/780; 438/709; 438/788; 257/E51.022
(58) Field of Classification Search .......... 438/725, 438/328, 780, 709, 788; 257/E51.022
See application file for complete search history.

(56) References Cited

U.S. PATENT DOCUMENTS

| | | |
|---|---|---|
| 6,515,428 B1 | 2/2003 | Yeh et al. |
| 7,935,578 B2 | 5/2011 | Choi et al. |
| 8,222,631 B2 | 7/2012 | Lee et al. |
| 2006/0045959 A1 | 3/2006 | Yasukawa et al. |
| 2007/0072348 A1 | 3/2007 | Chen |

FOREIGN PATENT DOCUMENTS

| | | |
|---|---|---|
| EP | 1 722 268 | 11/2006 |
| EP | 1 804 307 | 7/2007 |
| JP | 2006-066294 | 3/2006 |
| JP | 2007-165834 | 6/2006 |
| JP | 2006-261672 | 9/2006 |
| JP | 2007-250663 | 9/2007 |
| WO | 2008/069286 | 6/2008 |

OTHER PUBLICATIONS

Persidis et al: "LTPS-TFT Process for Amoled-Displays" The Proceedings of the 3-TH International TFT Conference, 2007, pp. 322-325 (In Eng.).

*Primary Examiner* — Bradley K Smith
*Assistant Examiner* — Amar Movva
(74) *Attorney, Agent, or Firm* — Michael J. Striker

(57) ABSTRACT

In a method for the manufacture of an active matrix OLED display, at least two thin-film transistors and one storage capacitor are provided to drive each pixel, with a reduced number of photolithographic patterning steps.

30 Claims, 16 Drawing Sheets

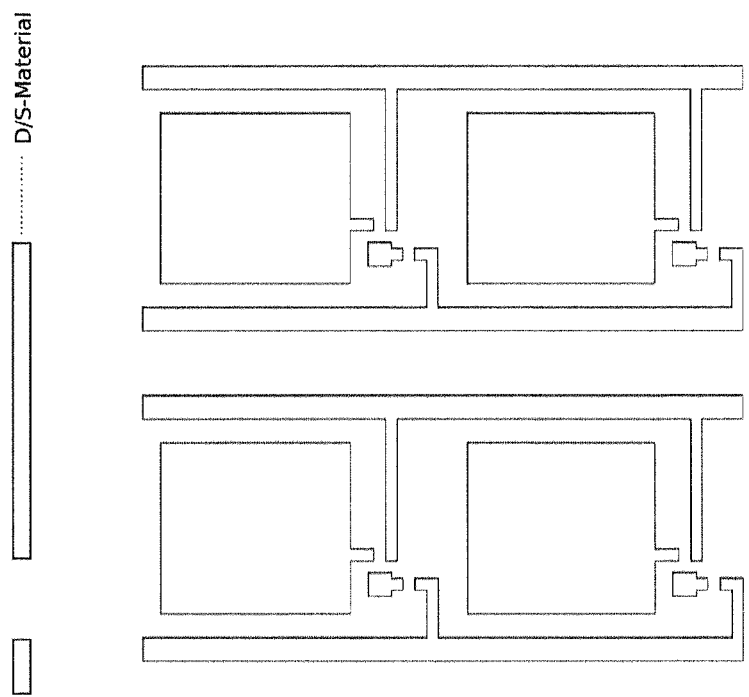
Fig. 3b
Fig. 3a

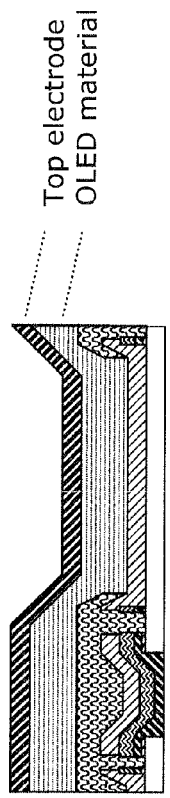
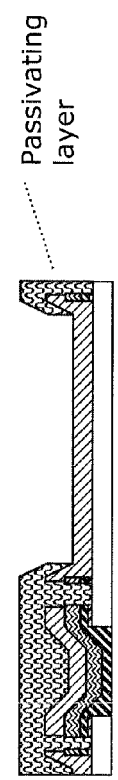
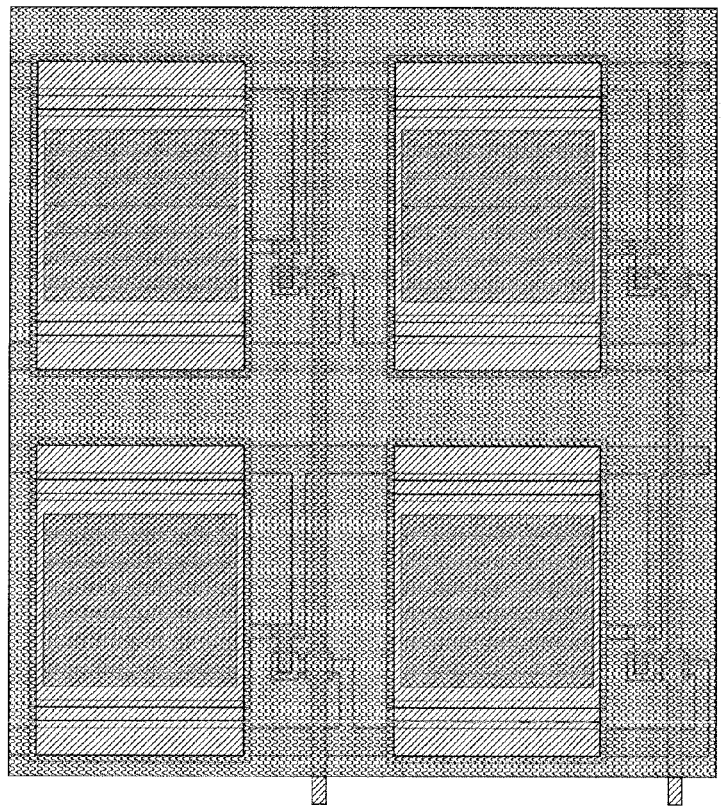
Fig. 5b
Fig. 5a

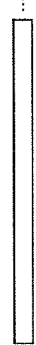
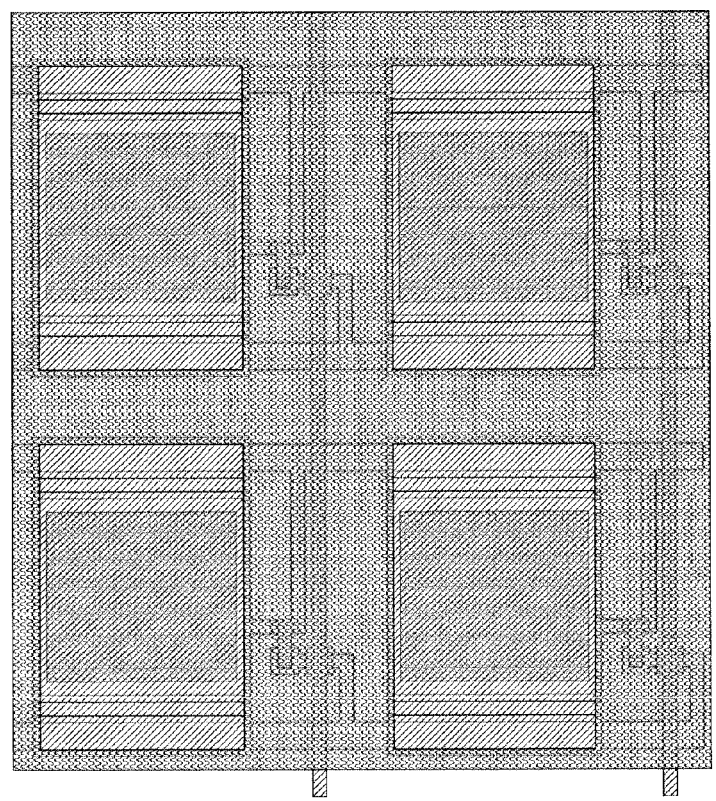
Fig. 6b
Fig. 6a

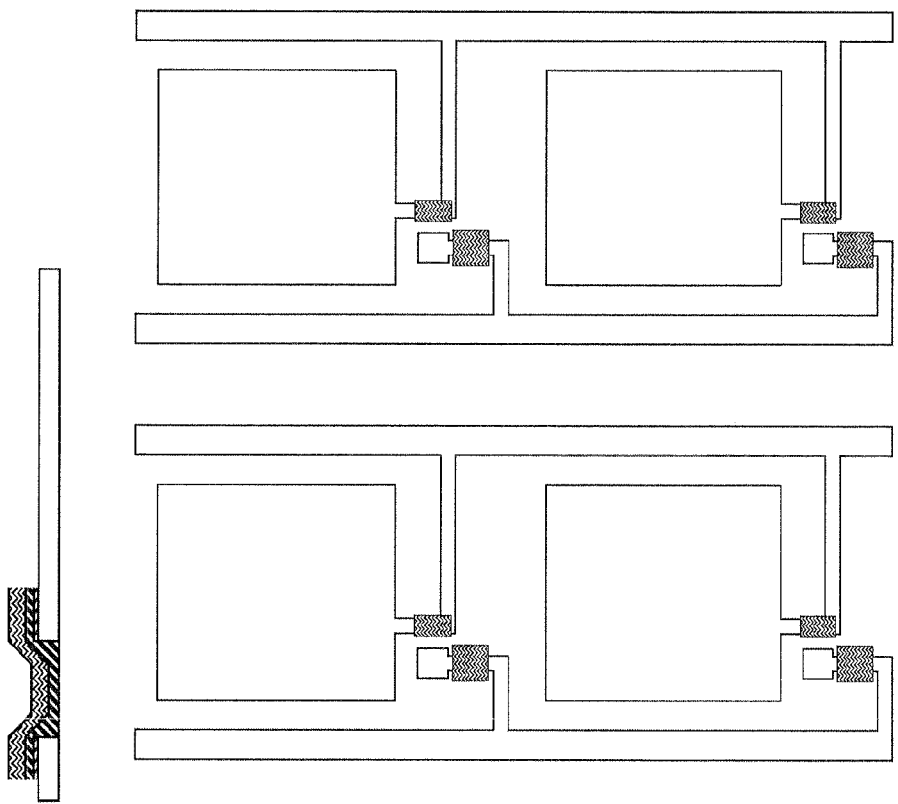
Fig. 6d
Fig. 6c

US 8,314,035 B2

METHOD FOR THE MANUFACTURE OF AN ACTIVE MATRIX OLED DISPLAY

CROSS-REFERENCE TO RELATED APPLICATION

The invention described and claimed hereinbelow is also described in German Patent Application DE 10 2009 007 945.5 filed on Feb. 6, 2009. This German Patent Application, whose subject matter is incorporated here by reference, provides the basis for a claim of priority of invention under 35 U.S.C. 119(a)-(d).

BACKGROUND OF THE INVENTION

The invention relates to a method for the manufacture of an active matrix OLED display wherein at least two thin-film transistors and one storage capacitor are provided to drive each pixel of the display.

The manufacture of active matrix OLED displays, that is to say displays with actively driven pixels that have organic light-emitting diodes (OLED), has hitherto required at least five photolithographic process steps. Corresponding methods of manufacture are described for example in "LTPS-TFT Process for AMOLED Displays", E. Persidis et al., ITC International Thin Film Transistor Conference, 2007, in US 2007/0072348 A1, and in U.S. Pat. No. 6,515,428 B1.

Yet the costs of industrial production of AMOLED displays are crucially governed by the complexity of the process, and hence in particular by the number of photolithographic process steps.

SUMMARY OF THE INVENTION

The problem which lies at the basis of the present invention is to provide methods for the manufacture of active matrix OLED displays that are less costly than known methods, whilst the characteristics of the displays thereby produced are qualitatively at least equal to the characteristics of displays manufactured by conventional methods.

The problem is solved by a method for the manufacture of an active matrix OLED display wherein at least two thin-film transistors and one storage capacitor are provided to drive each pixel of the display, that is characterized by the following steps:

a. deposition of drain-source and column material on to a substrate followed by photolithographic patterning of the drain-source regions and column lines;
b. selective deposition of a doped semiconductor material and full-area deposition of an intrinsic semiconductor material and of a dielectric, by vacuum processes;
c. photolithographic patterning of through-interconnections for electrically connecting the thin-film transistors of the pixel circuit and the drain/source region of the driver transistor to the OLED material subsequently deposited;
d. application and photolithographic patterning of the gate and row material;
e. application of the OLED material and of the top electrode material for the OLED.

This method according to the invention involves just three photolithographic process steps. Through the elimination of two or more of the photolithographic masking steps required with known manufacturing methods, production costs for the manufacture of active matrix OLED displays can therefore be markedly reduced. Furthermore, the process is highly advantageous because interruption of vacuum between deposition of the doped and intrinsic semiconductor layers can be avoided. The deposition of all the materials can be performed by conventional vacuum processes such as PECVD (plasma enhanced chemical vapour deposition). The thin-film transistors formed during the manufacturing method are so-called top-gate transistors, which, though their use for LCD displays is considered to be problematic, are readily usable for driving OLED displays, as has proved to be the case with the displays manufactured in accordance with the invention.

The invention also relates to a method for the manufacture of an active matrix OLED display wherein at least two thin-film transistors and one storage capacitor are provided to drive each pixel of the display, and wherein the semiconductor is patterned to separately, that is characterized by the following steps:

a. deposition of drain-source and column material on to a substrate followed by photolithographic patterning of the drain-source regions and column lines;
b. selective deposition of a doped semiconductor material and full-area deposition of an intrinsic semiconductor material and of a first dielectric, by vacuum processes;
c. photolithographic patterning of the semiconductor islands;
d. deposition of a second dielectric by vacuum processes;
e. photolithographic patterning of through-interconnections for electrically connecting the thin-film transistors of the pixel circuit and the drain/source region of the driver transistor to the OLED material subsequently deposited;
f. application and photolithographic patterning of the gate and row material;
g. application of the OLED material and of the top electrode material for the OLED.

Patterning the semiconductor islands separately is advantageous if an additional reduction in leakage currents is desired. Furthermore, parasitic thin-film transistors are simultaneously avoided. Moreover, additional passivation of the thin-film transistors is not required, owing to the splitting-up of the deposition of the dielectric. Nevertheless this kind of arrangement does require a further photolithographic process step for the patterning of the semiconductor islands.

The method according to the invention for the manufacture of an active matrix OLED display wherein at least two thin-film transistors and one storage capacitor which are arranged underneath the OLED are provided to drive each pixel of the display, is characterized by the following steps:

a. as deposition of drain-source and column material on to a substrate followed by photolithographic patterning of the drain-source regions and column lines;
b. selective deposition of a doped semiconductor material and full-area deposition of an intrinsic semiconductor material and of a dielectric, by vacuum processes;
c. photolithographic patterning of through-interconnections for electrically connecting the two thin-film transistors of the pixel circuit and the drain-source regions of the driver transistor to the OLED bottom electrode to be subsequently deposited;
d. application and photolithographic patterning of the gate and row material;
e. application and photolithographic patterning of a passivating and planarizing layer;
f. application and photolithographic patterning of the bottom electrode material of the OLED;
g. full-area application of the OLED material and of the top electrode material for the OLED.

Arranging the drive circuit underneath the OLED is advantageous if the aperture of the pixel needs to be as large as possible. This kind of arrangement does require a fifth photolithographic process step for the patterning of the anode of the OLED. On the other hand, the manufacture by state-ofthe-art methods of a display with a drive circuit arranged entirely underneath the OLED requires at least seven photolithographic patternings.

With these methods, the OLED material and top electrode material can preferably be applied by means of a shadow mask. Subsequent patterning of these materials is therefore unnecessary.

The doped semiconductor material can be selectively deposited by alternately depositing and etching the semiconductor material, which undergoes a stronger bond with the drain-source and column material than with the substrate material. Owing to the weaker atomic bonding forces between the semiconductor material and the substrate material, the semiconductor material is etched away more rapidly where it is applied directly over the substrate material than over the drain-source and column material. Therefore by choosing the cycle times for the deposition and etching of the semiconductor layers accordingly, it is possible for the doped semiconductor layer directly over the substrate material to be completely stripped away again in every etching step, while a thin semiconductor layer, which grows with every cycle step, is left on top of the drain-source and column material.

Further advantages accrue if microcrystalline silicon is used as intrinsic semiconductor material. Microcrystalline silicon forms crystals primarily through superficial growth, so that it is especially at the surface that the positive characteristics of this material become effective. As the transistors in this method are top-gate transistors, the channel of the transistors is located at the surface of the intrinsic semiconductor and directly beneath it. Hence it is precisely for this type of transistors that microcrystalline silicon is particularly well suited. By virtue of the crystallinity of the material, highly stable thin-film transistors can be made with microcrystalline silicon in a relatively simple process. Furthermore, the use of microcrystalline silicon is optimal because the selective deposition of silicon is realized as a contact layer in microcrystalline form. Microcrystalline silicon possesses a suitable band structure for this purpose. However, the method according to the invention can be realized with other semiconductors too.

Various metals can be used as drain-source and column material; but MoTa, with which the selective deposition of the semiconductor material can be realized relatively easily and with few cycles, can be used to particular advantage.

In a preferred variant of the methods, the overlap capacitances of the thin-layer transistors can be utilized as storage capacitor. This alone may suffice to maintain the voltage at the pixel. Alternatively or additionally, a storage capacitor can be formed by an enlarged region of overlap between the gate and the drain-source region of the driver transistor.

If full-area application of the OLED is desired, prior insulation of the underlying drive circuit is necessary. Therefore in this method variant, prior to the application of the OLED material and top electrode material, a passivating and planarizing layer is deposited and photolithographically patterned before the OLED material and top electrode material are applied over the full area of the display. Hence a fourth photolithographic process step is required. For the application of the OLED material and top electrode material, a shadow mask is not required.

The methods according to the invention enable other advantageous configurations to be realized. Thus, the line resistances of drain-source and column patterns can be reduced, and redundancies created, by making additional through-interconnections and adapted gate patterns. In this case, the layer stack is removed over the drain-source and column patterns with the through-hole mask, so that in the ensuing deposition and patterning of the gate material an additional metallizing layer is applied to the drain-source and column patterns in this region. This additional layer reduces line resistance and increases the yield in industrial production owing to the redundancies of individual patterns thereby created. Likewise, leakage currents can be minimized by subdividing patterns, especially the gate patterns. On the other hand, the aperture of the pixels can be increased by avoiding subdivision. Also, the through-interconnections can be patterned in such a way as to prevent the creation of parasitic thin-film transistors. In this case the through-interconnections are enlarged and/or additional through-interconnections are made in the region of the subsequent gate patterns.

Preferred example embodiments of active matrix OLED display manufacturing methods according to the invention will now be described in detail with the aid of the drawing.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIGS. 3a-3e are top views and cross-sections of pixels of an active matrix OLED display during various stages of a first manufacturing method;

FIGS. 5a & 5b are top views and cross-sections of pixels of an active matrix OLED display during the final stages of its manufacture by a second manufacturing method;

FIGS. 6a-6g are top views and cross-sections of a pixel of an active matrix OLED display during various stages of a third manufacturing method;

DESCRIPTION OF THE PREFERRED EMBODIMENTS

Figure 1:
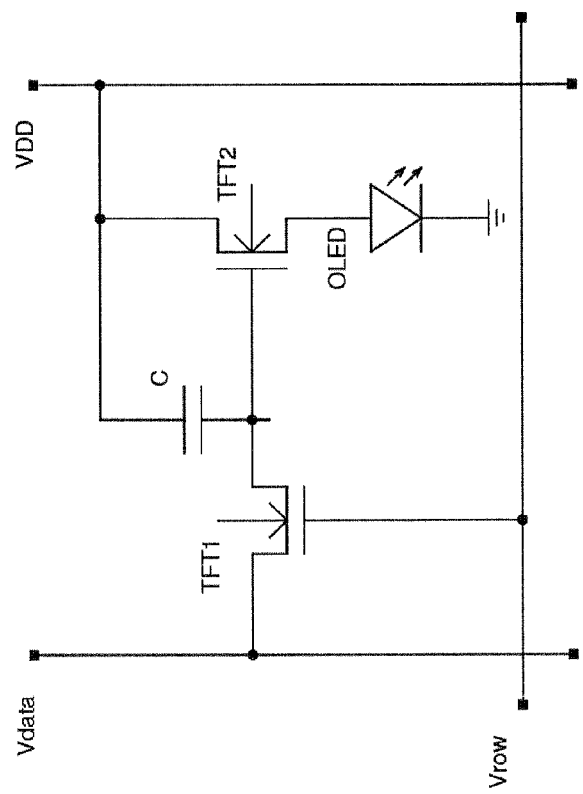
FIG. 1 shows a typical circuit diagram of a pixel of an active matrix OLED display.

FIG. 1 shows a typical circuit diagram of a pixel of an active matrix OLED display, with two thin-film transistors TFT1 and TFT2, a storage capacitor C, and a non-inverted OLED. The row signal Vrow is able to select the pixel via the transistor TFT1 (switching transistor), while the column signal Vcol controls the current flow through the OLED via the second transistor TFT2 (driver transistor). The storage capacitor C can be realized solely through the overlap capacitances of the thin-film transistors. Other pixel circuits can also be realized by the method according to the invention, for example circuits with inverted OLEDs, or with additional components to compensate for ageing phenomena.

Figure 2:
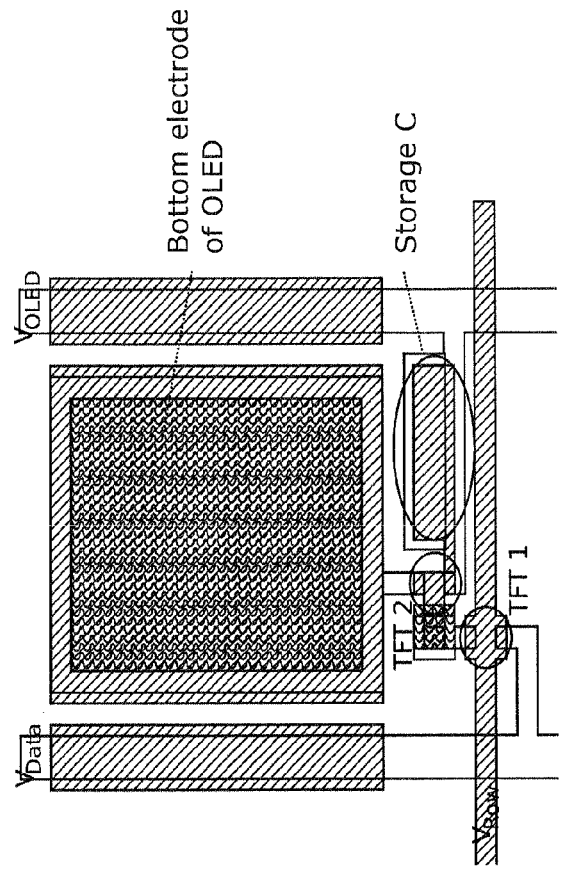
FIG. 2 is a top view of a pixel of an active matrix OLED display.

FIG. 2 shows the drain-source material and column material (drawn blank) and the gate and row material (drawn barred) of a pixel with a circuit diagram according to FIG. 1. The two thin-film transistors TFT1 and TFT2 and the storage capacitor of the pixel are is circled. The bottom electrode of the OLED is also highlighted (dark square).

Figure 3D:
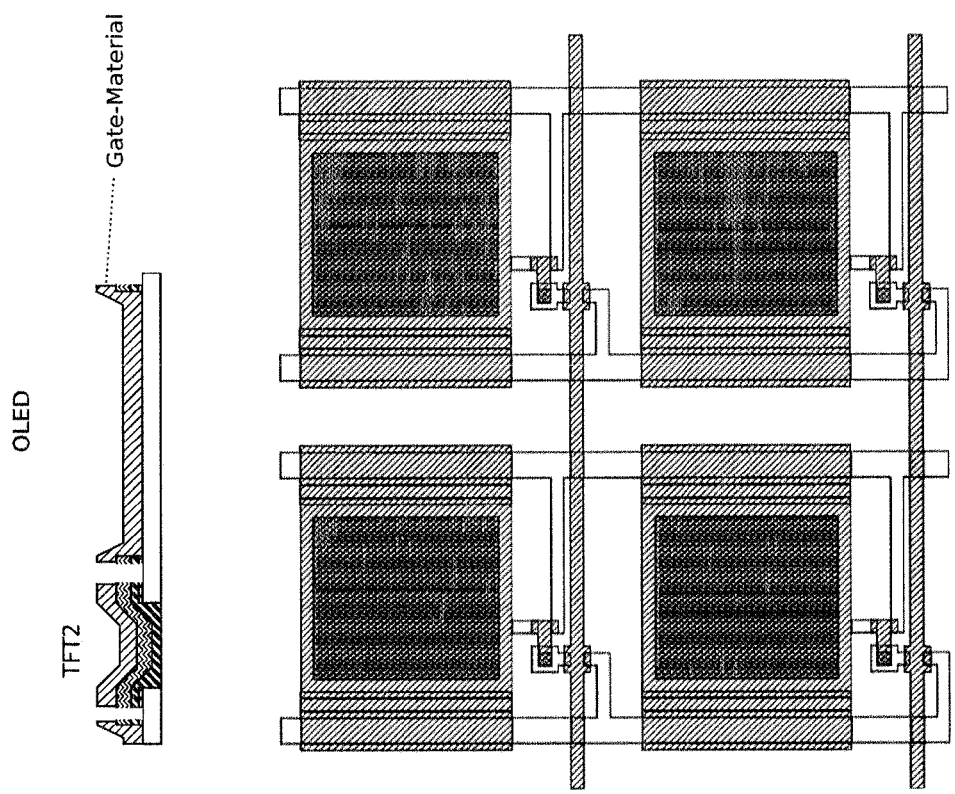
Figure 3C:
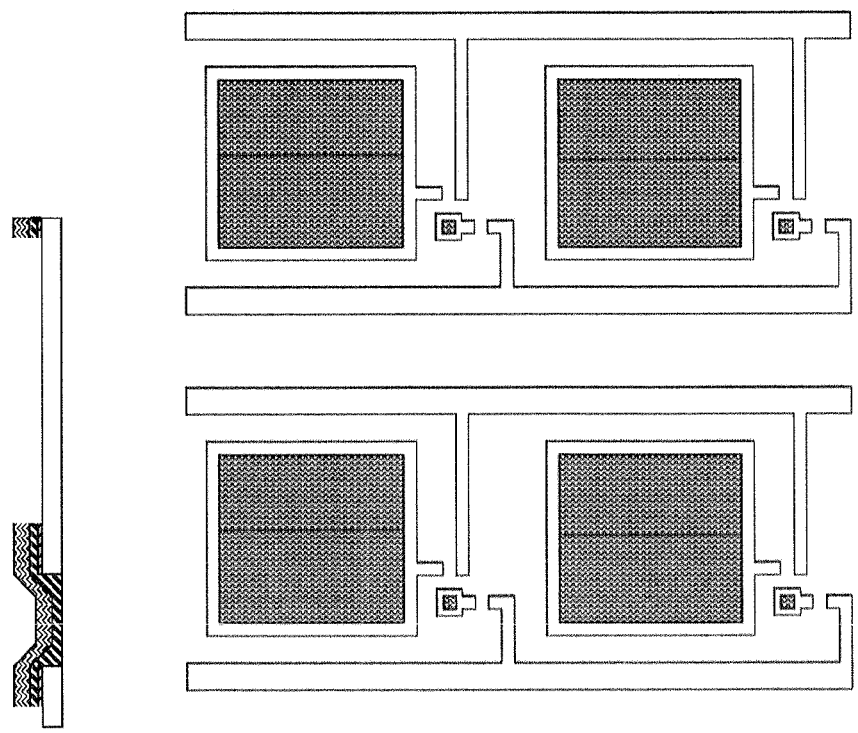
Figure 3E:
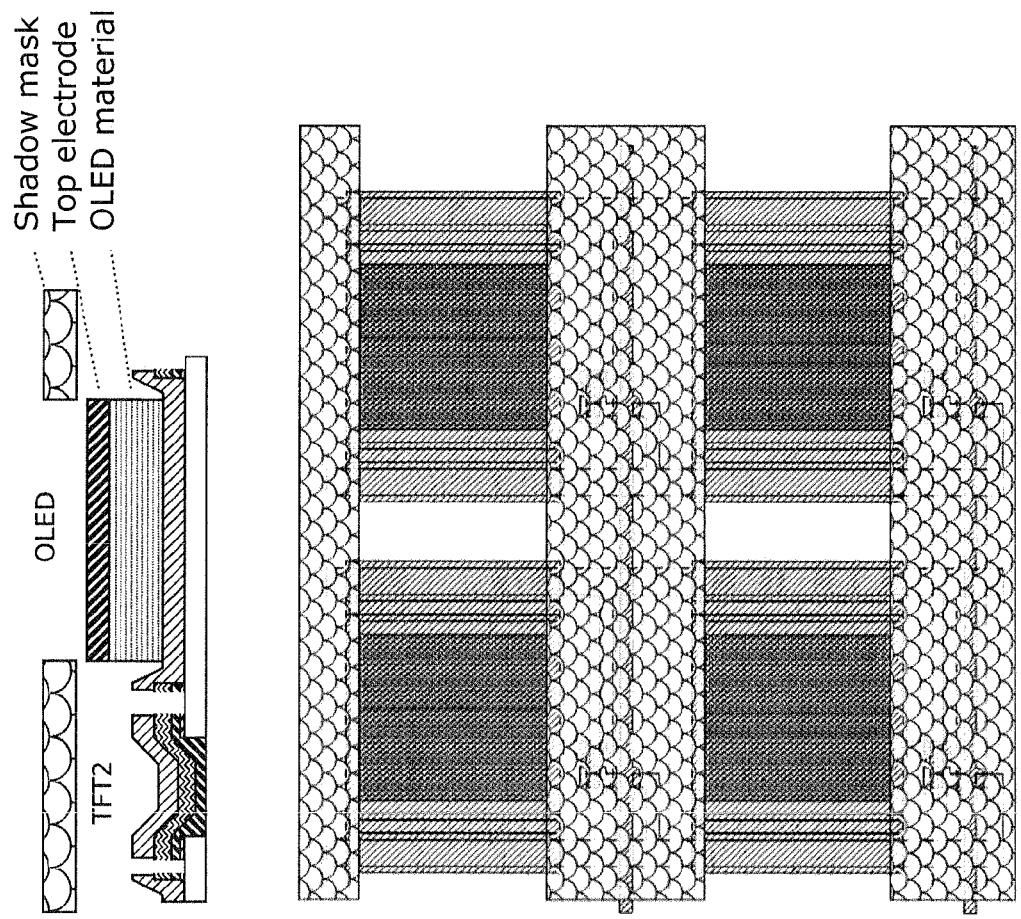

FIGS. 3a-3e illustrate the manufacture of four pixels of an active matrix OLED display by a first method, the storage capacitors of the pixels in this case being formed solely by the overlap capacitances of the thin-film transistors. The application and patterning of the drain-source and column material is shown (blank) in FIG. 3a. FIG. 3b shows in cross-section the selective deposition by vacuum processes of a doped semiconductor material, an intrinsic semiconductor material, and a dielectric (semiconductor layer stack). In FIG. 3c the patterning of the through-interconnections is illustrated in cross-section and in top view, before the gate and row material (shown barred) is applied and patterned in FIG. 3d. If the materials are not to be etched selectively, the gate material must cover parts of the column and drain-source pattern. This is necessary in order that the column lines do not come into direct contact with the OLED material. Finally, application of the OLED material (ruled with straight lines) and top electrode material (boldly barred) with the aid of a shadow mask (tiled) is shown in cross-section and top view in FIG. 3e.

Figure 4A:
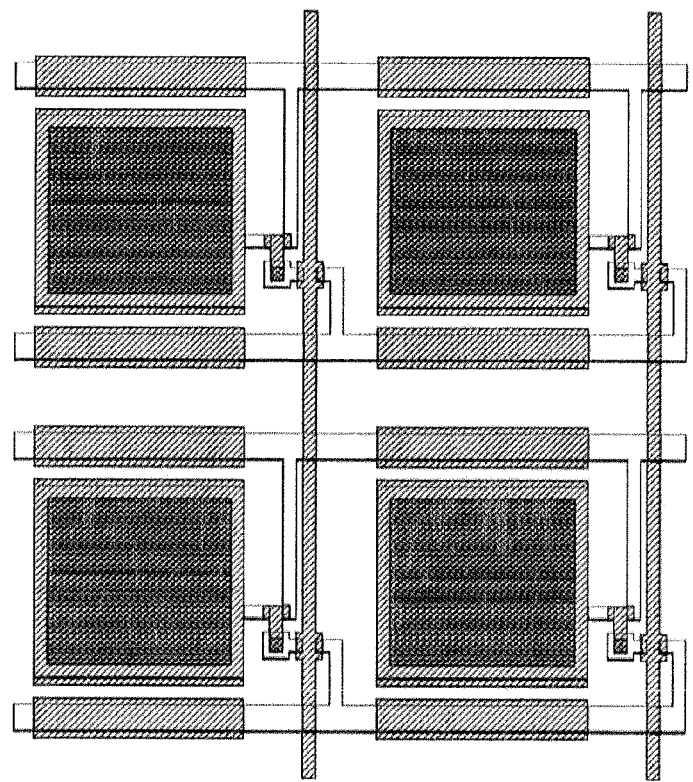
FIGS. 4a-4d show variants of the first manufacturing method with the aid of top views and cross-sections of pixels of a display.

FIG. 4a shows a patterning of the gate material that is an alternative to FIG. 3d and results in an improved leakage-current behaviour of the display. With the patterning of FIG. 3d, the gate material extends right across the columns without any interruptions. That can lead to undesired leakage currents through Schottky diodes. This can be minimized by patterning the gate material as shown in FIG. 4a.

Figure 4B:
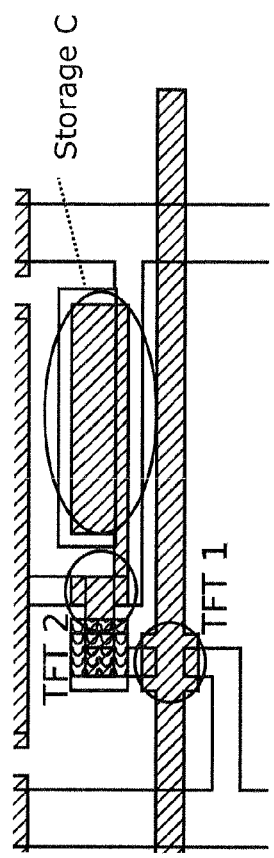

In FIG. 4b an enlarged region of overlap between the gate and drain/source material of the TFT2 is shown, resulting in the formation of a distinct storage capacitor C.

Figure 4D:
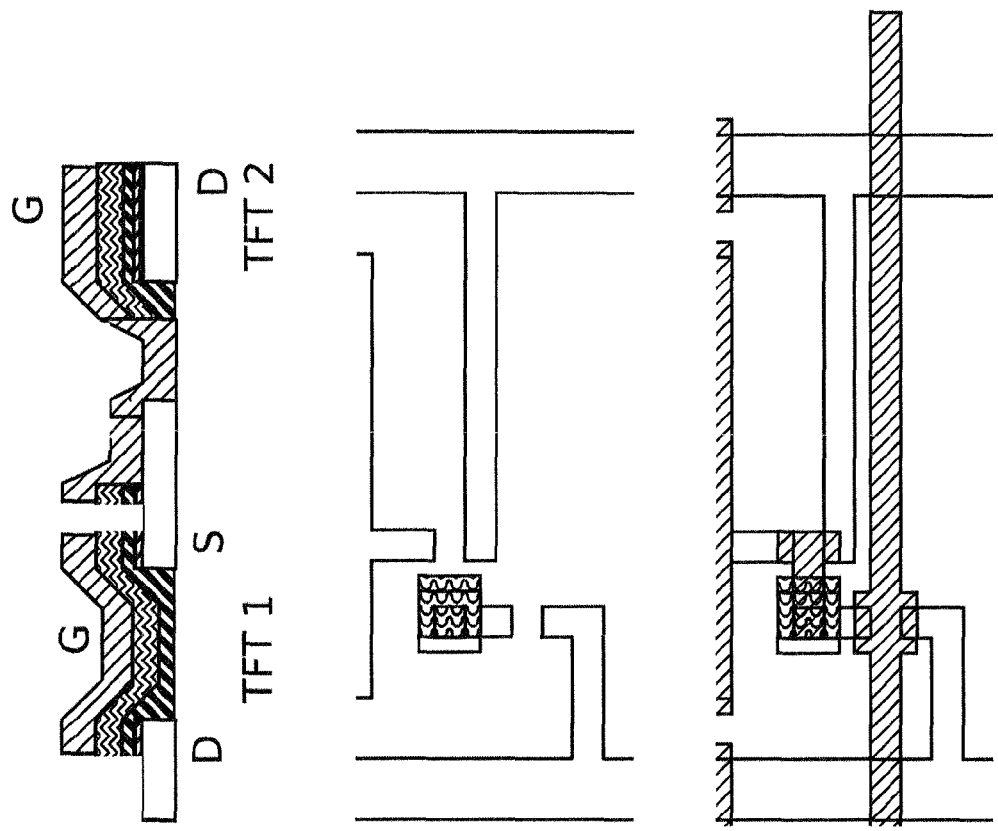
Figure 4C:
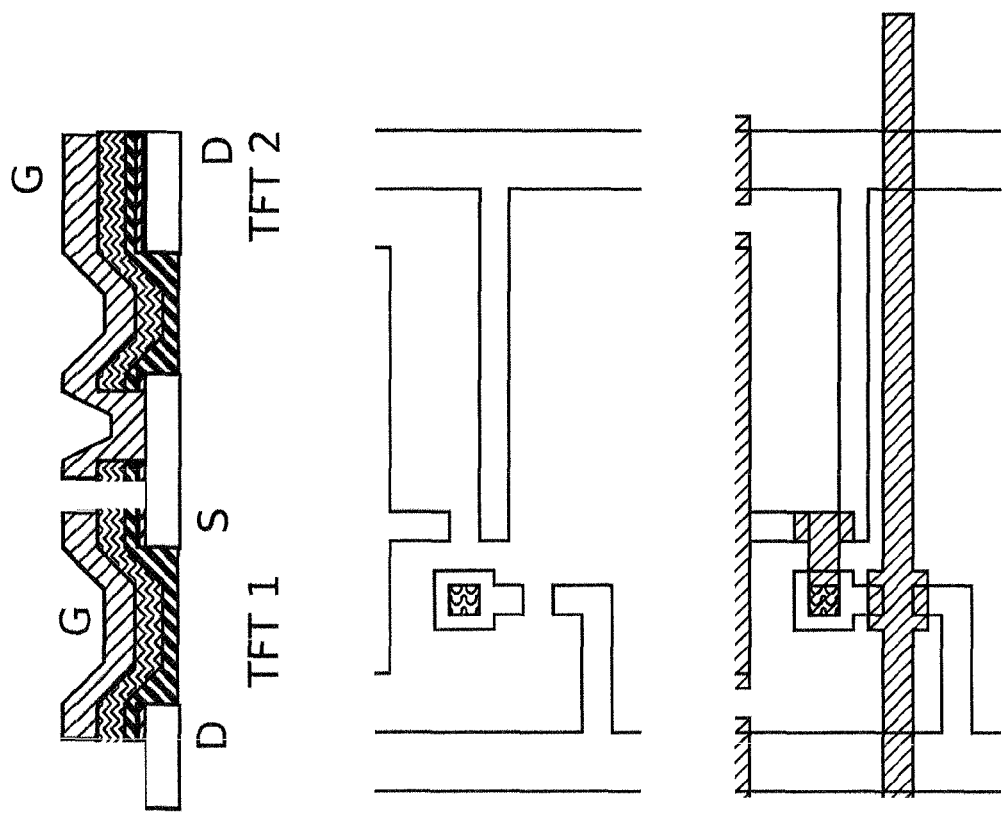

Lastly, FIG. 4c shows more clearly the patterning of the semiconductor islands shown in FIG. 3c; while FIG. 4d shows a variant patterning of the semiconductor islands in which the formation of parasitic TFTs is avoided, as is particularly evident from the cross-section views of FIGS. 4c and 4d. The parasitic transistors present in FIG. 4c between the source contact of TFT1, the gate and the D-S contacts of TFT2 are absent in FIG. 4d.

Figure 5C:
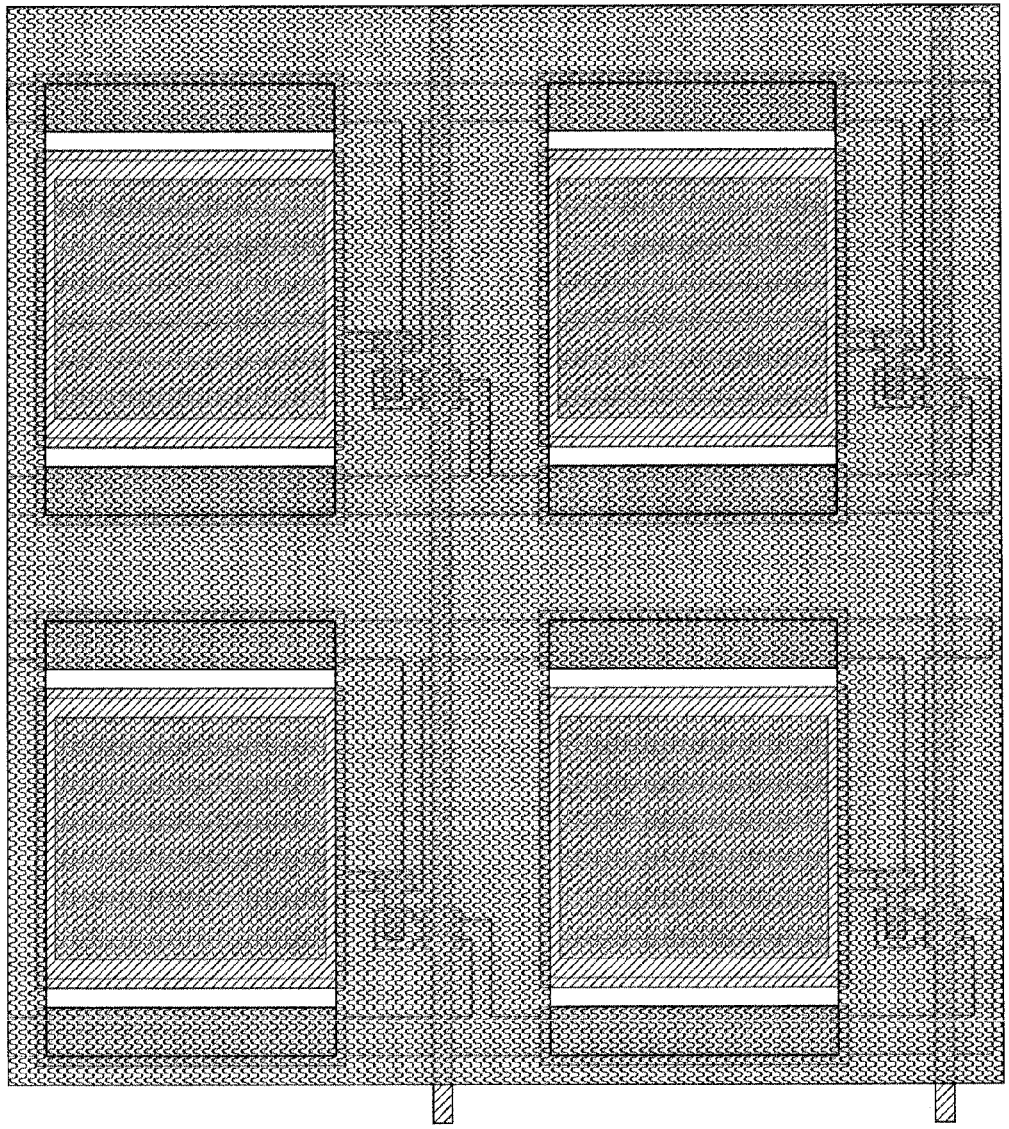
FIG. 5c is a top view of a pixel according to FIG. 5b with alternative patterning of the passivating layer.

If the OLED material is to be deposited over the whole area of the pixel, the method according to FIGS. 5a and 5b can be adopted. As FIG. 5a shows, prior to the application of the OLED material, a passivating layer (wavy lines) is applied and photolithographically patterned. The OLED material (straight lines) and the top electrode material (boldly barred) can then be deposited over the whole area, as shown in FIG. 5b. An alternative patterning of the passivating layer to FIG. 5a, one that improves the leakage current behaviour of the display, is shown in FIG. 5c.

Figure 6F:
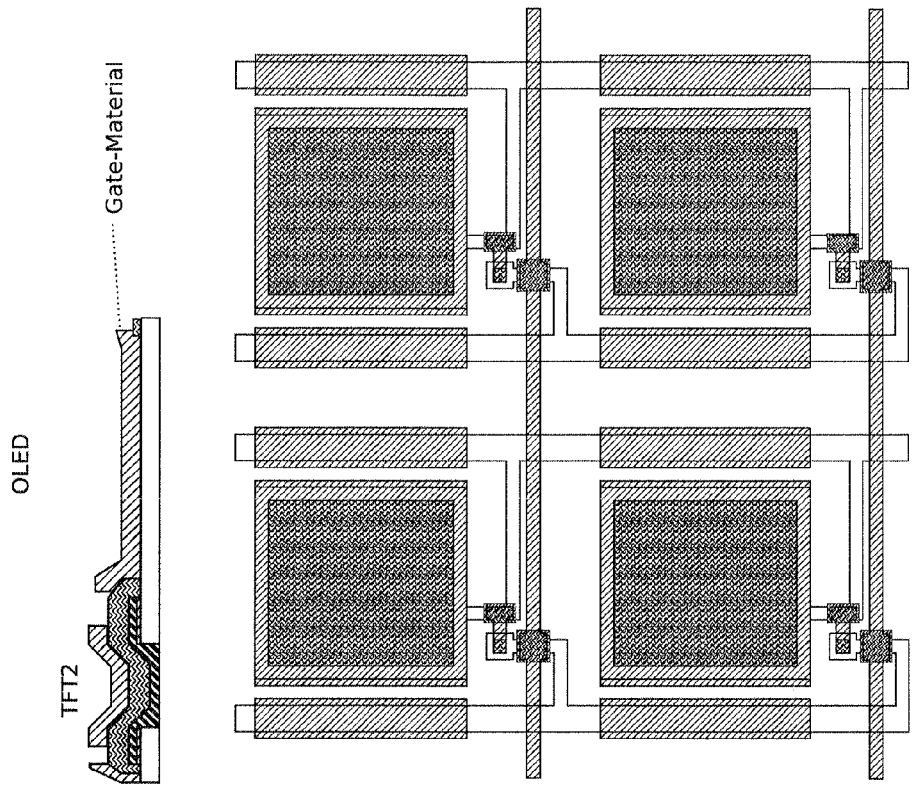
Figure 6E:
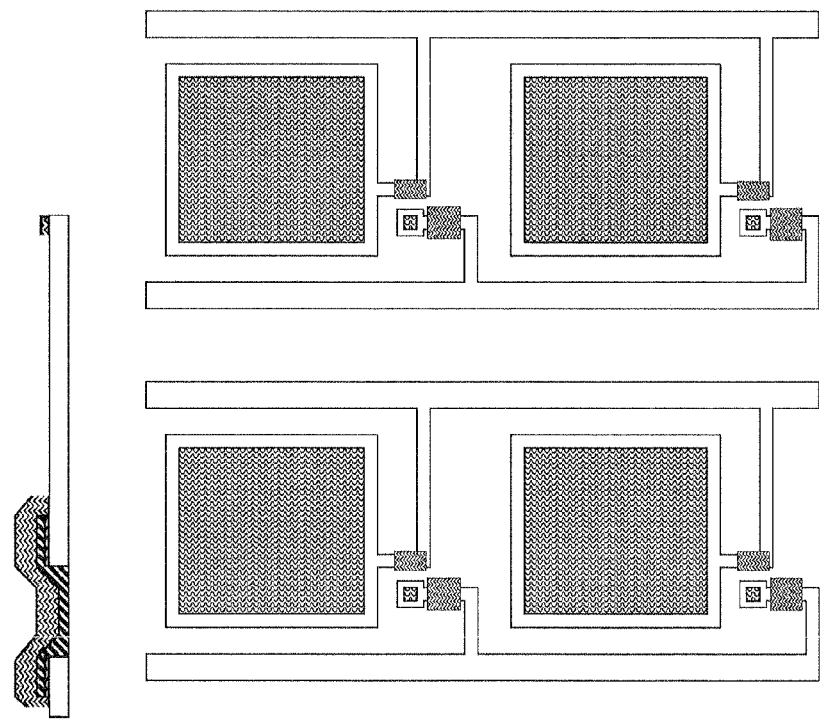
Figure 6G:
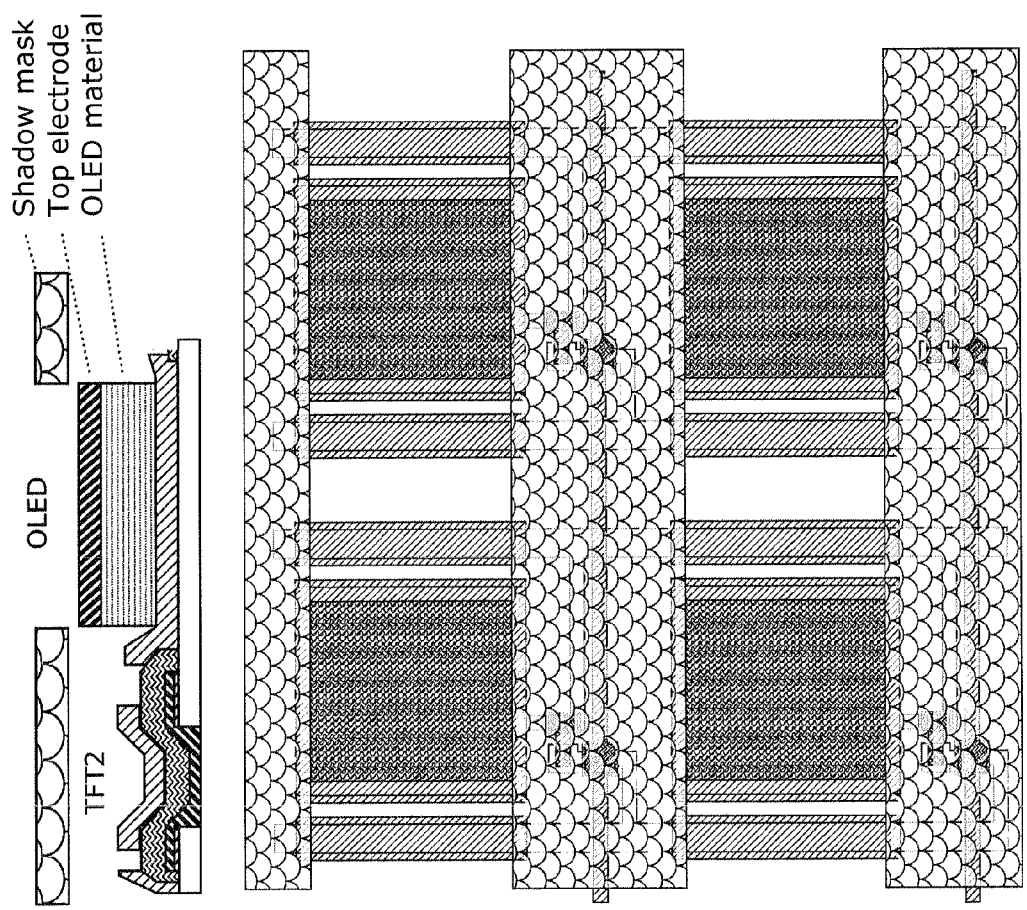

FIGS. 6a-6g show the carrying-out of a method for the manufacture of an active matrix OLED display in which the semiconductor islands of the thin-film transistors are patterned separately. The steps shown in FIGS. 6a-6g correspond in principle to the steps of FIGS. 3a-3c. First, however, the semiconductor islands are patterned as shown in FIG. 6c, and then a further dielectric layer is deposited over the whole area as shown in FIG. 6d.

Figure 7A:
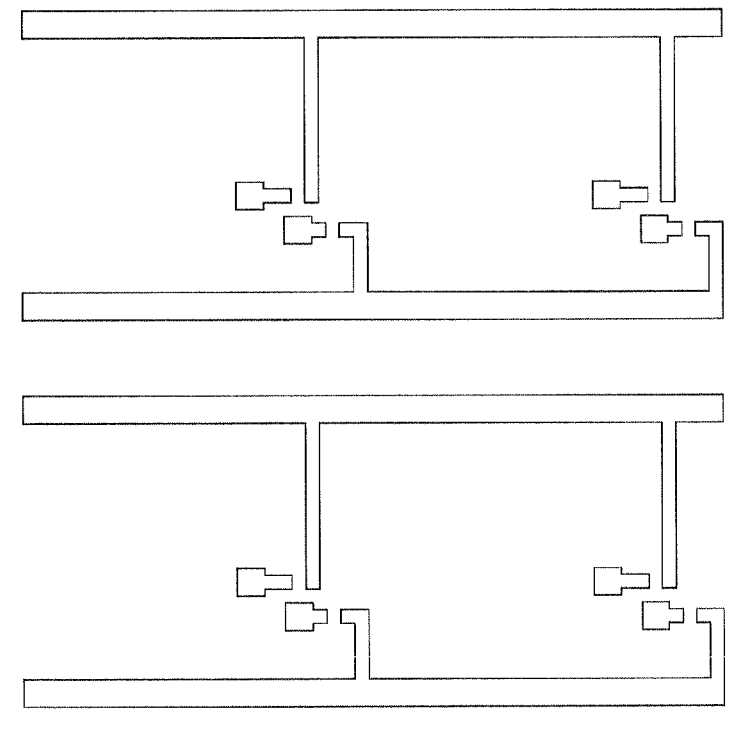
FIGS. 7a-7g are top views and cross-sections of a pixel of an active matrix OLED display during various stages of a fourth manufacturing method.
Figure 7B:
Figure 7D:
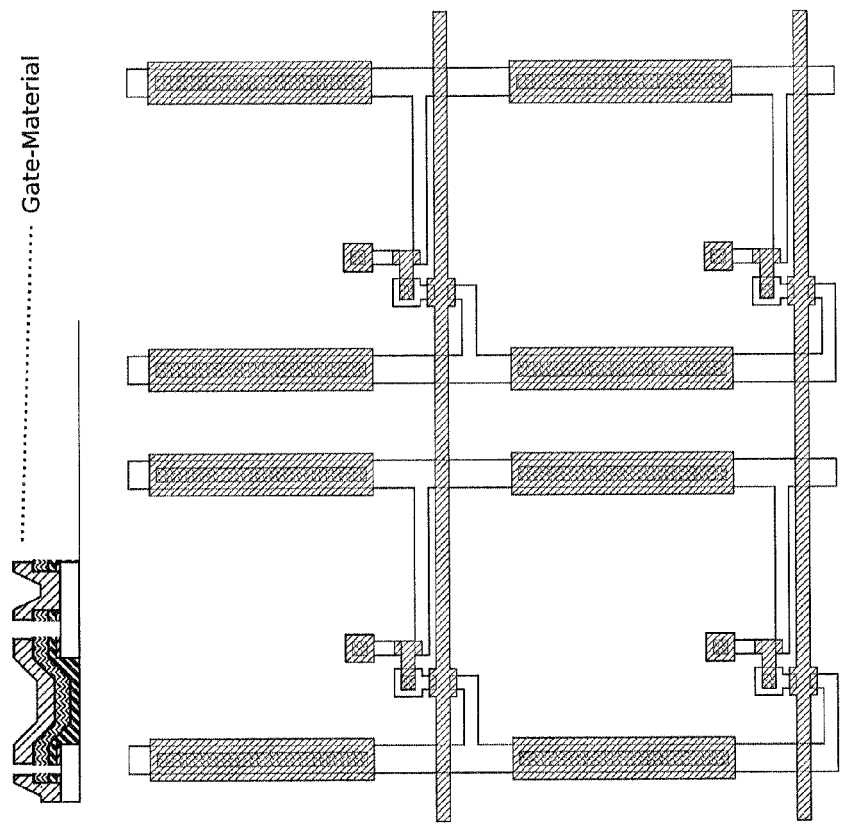
Figure 7C:
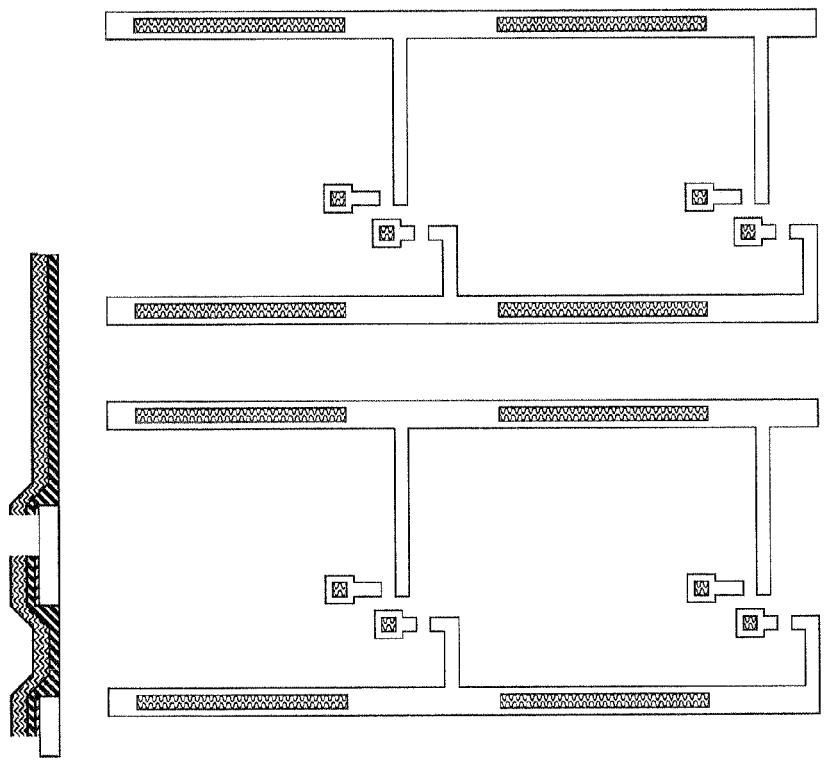
Figure 7F:
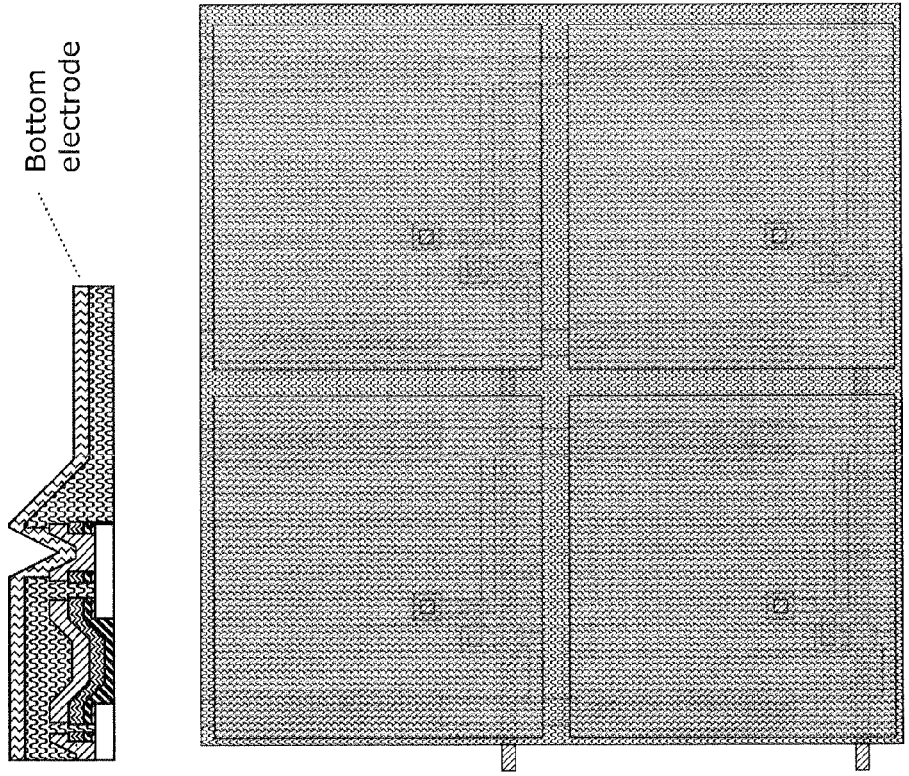
Figure 7E:
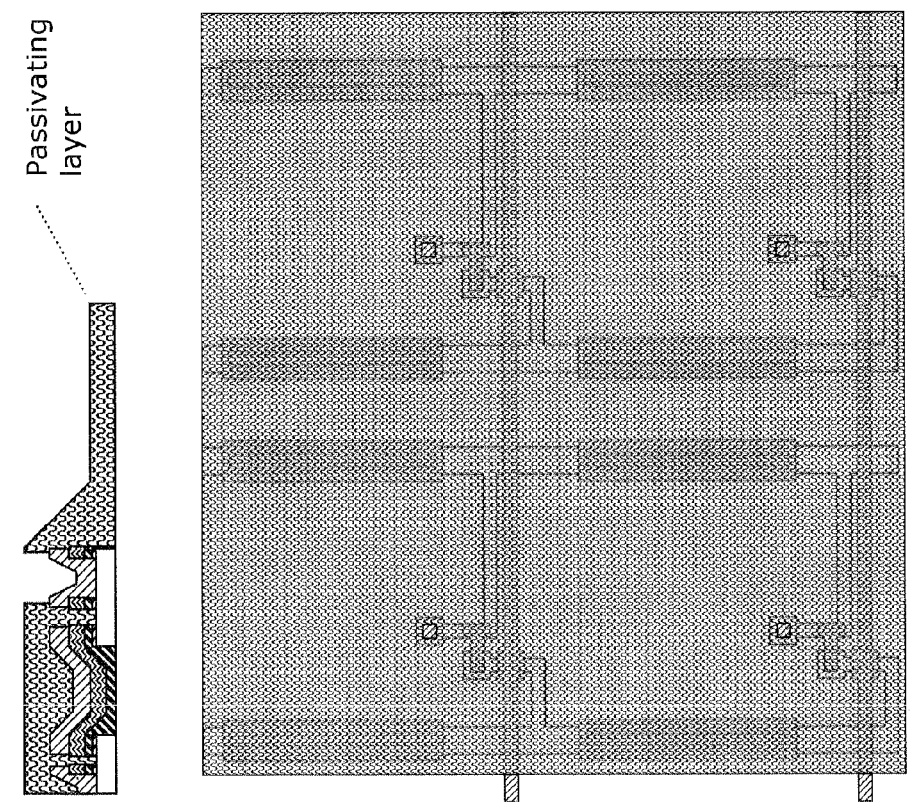
Figure 7G:
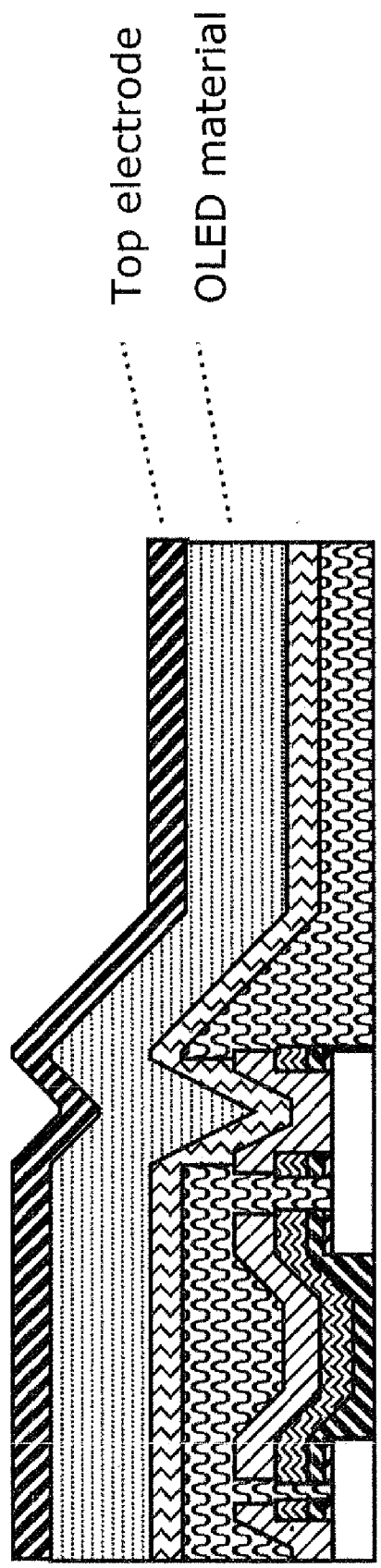

FIGS. 7a-7g depict the carrying-out of a method for the manufacture of an active matrix OLED display in which the drive circuits of the pixels are arranged entirely underneath the OLED. The steps shown in FIGS. 7a-7d correspond in principle to the steps of FIGS. 3a-3d, but in this instance a bottom electrode for the OLED is not patterned. Next, as shown in FIG. 7e, a passivating layer (hatched with wavy lines) is applied and patterned, before—as shown in FIGS. 7f and 7g—full-area applications are made of, firstly, the bottom electrode material (which is photolithographically patterned), then the material of the OLED proper, and, lastly, the top electrode material of the OLED.

As FIG. 7c shows, through-interconnections are also patterned in the case of the columns. The subsequent overlapping of these locations with row and gate material (FIG. 7d) results in reduced line resistances and in redundancies. The latter can be exploited in case of defects in the patterning of the column material, thus enabling productive yields to be increased. These redundancies and reductions in line resistances can be applied wherever a sufficient distance exists between the column or drain-source material and the rows or TFTs. This reduction in line resistances and facilitation of redundancies can also be realized with the methods using three or four lithographic masks (FIGS. 3a-3c; FIGS. 4a-4d; FIGS. 5a-5c).

What is claimed:

1. A method of manufacturing an active matrix OLED display wherein at least two thin-film transistors and one storage capacitor are provided to drive each pixel of the display, the method comprising the steps of depositing a drain-source and column material on to a substrate followed by photolithographic patterning of drain-source regions and column lines; selectively depositing a doped semiconductor material and full-area depositing of an intrinsic semiconductor material and of a dielectric, by vacuum processes; photolithographically patterning through-interconnections; applying and photolithographically patterning a gate and row material; applying an OLED material and a top electrode material for the OLED; and electrically connecting the thin-film transistors of a pixel circuit and the drain/source region of a driver transistor to the OLED material via the through-interconnections.

2. A method according to claim 1, further comprising applying the OLED material on top of a third material by a shadow mask.

3. A method according to claim 1, further comprising selectively depositing the doped semiconductor material by alternately depositing and etching the semiconductor material, which undergoes a stronger bond with the drain-source and column material then the substrate material.

4. A method as defined in claim 1, and further comprising using a microcrystalline silicon as intrinsic semiconductor material.

5. A method as defined in claim 1, and further comprising using MoTa as the drain-source and column material.

6. A method as defined in claim 1, further comprising utilizing overlap capacitances of the thin-film transistors as storage capacitor.

7. A method as defined in claim 1, further comprising forming a storage capacitor by an enlarged area of overlapping between the gate and drain or source of the driver transistor.

8. A method as defined in claim 1, further comprising prior to applying of the OLED material and top electrode material, depositing a passivating and planarizing layer and photolithographically patterning before the OLED material and top electrode material are applied over the full area of the display.

9. A method as defined in claim 1, further comprising reducing line resistances of the drain-source and column patterns, and creating redundancies by making additional through-interconnections and adapted gate patterns.

10. A method as defined in claim 1, further comprising preventing a formation of parasitic thin-film transistors through a provision of enlarged and/or additional through-interconnections.

11. A method of manufacturing of an active matrix OLED display wherein at least two thin-film transistors and one storage capacitor are provided to drive each pixel of the display, and wherein a semiconductor is patterned separately, the method comprising the steps of depositing drain-source and column material on to a substrate followed by photolithographic patterning of drain-source regions and column lines; selectively depositing a doped semiconductor material and full-area depositing an intrinsic semiconductor material and a first dielectric, by vacuum processes; photolithographically patterning semiconductor islands; depositing a second dielectric by vacuum processes; photolithographically patterning through-interconnections; applying and photolithographically patterning a gate and row material; applying an OLED material and a top electrode material for the OLED; and electrically connecting the thin-film transistors of a pixel circuit and the drain/source region of a driver transistor to the OLED material via the through-interconnections.

12. A method according to claim 11, further comprising applying the OLED material on top of a third material by a shadow mask.

13. A method according to claim 11, further comprising selectively depositing the doped semiconductor material by alternately depositing and etching the semiconductor material, which undergoes a stronger bond with the drain-source and column material then the substrate material.

14. A method as defined in claim 11, and further comprising using a microcrystalline silicon as intrinsic semiconductor material.

15. A method as defined in claim 11, and further comprising using MoTa as the drain-source and column material.

16. A method as defined in claim 11, further comprising utilizing overlap capacitances of the thin-film transistors as storage capacitor.

17. A method as defined in claim 11, further comprising forming a storage capacitor by an enlarged area of overlapping between the gate and drain or source of the driver transistor.

18. A method as defined in claim 11, further comprising prior to applying of the OLED material and top electrode material, depositing a passivating and planarizing layer and photolithographically patterning before the OLED material and top electrode material are applied over the full area of the display.

19. A method as defined in claim 11, further comprising reducing line resistances of the drain-source and column patterns, and creating redundancies by making additional through-interconnections and adapted gate patterns.

20. A method as defined in claim 11, further comprising preventing a formation of parasitic thin-film transistors through a provision of enlarged and/or additional through-interconnections.

21. A method of manufacturing an active matrix OLED display wherein at least two thin-film transistors and one storage capacitor which are arranged underneath an OLED are provided to drive each pixel of the display, the method comprising the steps of depositing drain-source and column material on to a substrate followed by photolithographic patterning of drain-source regions and column lines; selectively depositing a doped semiconductor material and full-area depositing an intrinsic semiconductor material and a dielectric, by vacuum processes; photolithographically patterning through-interconnections; applying and photolithographically patterning a gate and row material; applying and photolithographically patterning a passivating and planarizing layer; applying and photolithographically patterning a bottom electrode material of an OLED; full-area applying the OLED material and of a top electrode material for the OLED; and electrically connecting two thin-film transistors of a pixel circuit and the drain/source regions of a driver transistor the OLED bottom electrode material.

22. A method according to claim 21, further comprising applying the OLED material on top of a third material by a shadow mask.

23. A method according to claim 21, further comprising selectively depositing the doped semiconductor material by alternately depositing and etching the semiconductor material, which undergoes a stronger bond with the drain-source and column material then the substrate material.

24. A method as defined in claim 21, and further comprising using a microcrystalline silicon as intrinsic semiconductor material.

25. A method as defined in claim 21, and further comprising using MoTa as the drain-source and column material.

26. A method as defined in claim 21, further comprising utilizing overlap capacitances of the thin-film transistors as storage capacitor.

27. A method as defined in claim 21, further comprising forming a storage capacitor by an enlarged area of overlapping between the gate and drain or source of the driver transistor.

28. A method as defined in claim 21, further comprising prior to applying of the OLED material and top electrode material, depositing a passivating and planarizing layer and photolithographically patterning before the OLED material and top electrode material are applied over the full area of the display.

29. A method as defined in claim 21, further comprising reducing line resistances of the drain-source and column patterns, and creating redundancies by making additional through-interconnections and adapted gate patterns.

30. A method as defined in claim 21, further comprising preventing a formation of parasitic then-film transistors through a provision of enlarged and/or additional through-interconnections.

* * * * *